(12) United States Patent
Hansel et al.

(10) Patent No.: US 11,693,050 B2
(45) Date of Patent: Jul. 4, 2023

(54) SEMICONDUCTOR INSPECTING METHOD

(71) Applicant: MPI Corporation, Hsinchu Hsiang (TW)

(72) Inventors: Volker Hansel, Coswig (DE);
Sebastian Giessmann, Dresden (DE);
Frank Fehrmann, Dresden (DE);
Chien-Hung Chen, Hsinchu Hsiang (TW)

(*) Notice: Subject to any disclaimer, the term of this patent is extended or adjusted under 35 U.S.C. 154(b) by 0 days.

(21) Appl. No.: 17/524,833

(22) Filed: Nov. 12, 2021

(65) Prior Publication Data

US 2022/0155366 A1    May 19, 2022

Related U.S. Application Data

(60) Provisional application No. 63/113,199, filed on Nov. 13, 2020.

(51) Int. Cl.

| | |
|---|---|
| *G01R 31/28* | (2006.01) |
| *G01R 1/02* | (2006.01) |
| *G01R 1/04* | (2006.01) |
| *G01R 1/067* | (2006.01) |
| *G01R 1/073* | (2006.01) |
| *H01L 21/66* | (2006.01) |

(52) U.S. Cl.
CPC ..... *G01R 31/2891* (2013.01); *G01R 31/2887* (2013.01); *H01L 22/12* (2013.01)

(58) Field of Classification Search
CPC .... G01R 31/02; G01R 31/28; G01R 31/2891; G01R 31/2287; G01R 1/02; G01R 1/04; G01R 1/067; G01R 1/073
See application file for complete search history.

(56) References Cited

U.S. PATENT DOCUMENTS

| | | | |
|---|---|---|---|
| 7,057,408 B2 | 6/2006 | Schneidewind et al. | |
| 7,733,108 B2 | 6/2010 | Kanev et al. | |
| 2009/0239316 A1* | 9/2009 | Li | G01R 31/2891 |
| | | | 257/E21.531 |
| 2021/0116496 A1* | 4/2021 | Lou | G01R 1/07342 |

* cited by examiner

*Primary Examiner* — Neel D Shah

(57) ABSTRACT

The semiconductor inspecting method includes following steps. First, a first position of a probe needle from above is defined by adopting a vision system of a semiconductor inspecting system. Then, a first relative vertical movement between the probe needle and the pad is made by adopting a driving system of the semiconductor inspecting system. Thereafter, a minimum change in position of the probe needle corresponding to the first position is recognized by adopting the vision system of the semiconductor inspecting system. Next, the first relative vertical movement is stopped by adopting the driving system of the semiconductor inspecting system.

5 Claims, 8 Drawing Sheets

SEMICONDUCTOR INSPECTING METHOD

BACKGROUND OF THE INVENTION

Field of the Disclosure

The present invention relates to a semiconductor inspecting method, and more particularly to the semiconductor inspecting method for ensuring the probe needle in contact with the pad.

Description of Related Art

In the field of semiconductor wafer testing, the pad on a silicon wafer is in contact with the tip of the probe needle for electrical connection and testing. In detail, the silicon chip is on a wafer chuck. When the wafer chuck and the probe slowly and gradually approach to each other, the pad will be touched by the tip of the probe needle (means CONTACT).

Furthermore, the metal surface of the pad is usually covered with an oxide layer, so an appropriate force must be applied to the probe needle to scratch the oxide layer. Accordingly, the tip of the probe needle must scrape a proper scrubbing length on the oxide layer of the pad to scratch the oxide layer and make the probe needle be in contact with the metal surface of the pad to test the silicon wafer effectively.

Therefore, after the pad is in contact with the tip of the probe needle by the aforementioned method, the wafer chuck must continue to rise so as to make the tip of the probe needle scrape the proper scrubbing length on the oxide layer. The continuously rising distance of the wafer chuck to make the scrubbing length is defined in the art as an overdrive value (OD value).

Generally speaking, in the beginning of semiconductor inspecting, the operator repeats the aforementioned method many times in different place of the surface of the wafer in order to get a proper overdrive value (e.g. 10 um or 50 um) experimentally. Once the proper overdrive value is determined or fixed, the operator will use the fixed proper overdrive value in subsequent inspecting to make the tip of the probe needle scrape the proper scrubbing length on the oxide layer, so as to make the probe needle be in contact with the metal surface of the pad to test the silicon wafer effectively during the formal semiconductor inspecting next.

But the traditional semiconductor inspecting method is to ensure that the tip of the probe needle is in contact with the pad via manual visual inspection. In normal way, the operator sees whether the probe needle is in contact with the pad via a microscope mounting above the pad. By the microscope, the operator sees the tip of the probe needle moving on the pad and determines whether the tip of the probe needle is in contact with the pad or not. But it is easy to misjudge because the movement is very tiny, and the tiny movement is hard to be recognized by manual visual inspection.

Once the relation of the tip of the probe needle and the pad is misjudged, the aforementioned fixed proper overdrive value will be determined incorrectly. Thus, if the fixed proper overdrive value is overestimated, the pressure of the probe needle will be too high because the probe needle and the pad are severely interfered with each other. Or, in the opposite situation, the tip of the probe needle will not be in contact with the metal surface of the pad if the fixed proper overdrive value is underestimated.

Besides of the abovementioned misjudgment, some other factors, e.g. the thermal deformation and the warpage of different wafers and the wear of the probe needle, will also make the fixed proper overdrive value no longer valid. Specifically, how to determine the fixed proper overdrive value is based on [CONTACT] point. Thus, once the [CONTACT] point is changed because of aforementioned factors, and the inspection system can't obtain and correct it timely, the fixed proper overdrive value can't lead to the proper scrubbing length on the pad.

Therefore, how to ensure that the probe needle is in contact with the pad and does not cause excessive pressure on the probe needle, and how to ensure that the probe needle is in contact with the metal surface of the pad is worth considering for person having ordinary skill in the art.

SUMMARY OF THE INVENTION

The objective of the present invention is to provide a semiconductor inspecting method. The semiconductor inspecting method can ensure the probe needle is in contact with the pad and eventually in contact with the metal surface of the pad.

The semiconductor inspecting method includes following steps.

Step (a): A first position of a probe needle from above is defined by adopting a vision system of a semiconductor inspecting system.

Step (b): A first relative vertical movement between the probe needle and the pad is made by adopting a driving system of the semiconductor inspecting system.

Step (c): A minimum change in position of the probe needle corresponding to the first position is recognized by adopting the vision system of the semiconductor inspecting system.

Step (d): The first relative vertical movement is stopped by adopting the driving system of the semiconductor inspecting system.

In the semiconductor inspecting method, the step (c) further includes following steps.

Step (c1): A second position of the probe needle on the pad is obtained by adopting the vision system.

Step (c2): The second position with the first position is compared to recognize whether the probe needle is contacted with the pad or not. Furthermore, in the step (c2) the probe needle is recognized as being contacted with the pad if moving length of the probe needle on the pad is equal to or larger than a first preset value.

In the semiconductor inspecting method, in the step (d) the first relative vertical movement is simultaneously stopped when the minimum change in position of the probe needle corresponding to the first position is recognized.

In the semiconductor inspecting method, the vision system comprises a top CCD mounting above the pad.

In the semiconductor inspecting method, the semiconductor inspecting method further includes a following step after the step (d):

Step (e): A second relative vertical movement between the probe needle and the pad is made by adopting the driving system of the semiconductor inspecting system in order to generate a scrubbing length of the probe needle on the pad. In addition, the scrubbing length is equal to or slightly larger than a second preset value.

The present disclosure has the following advantages:
(1) The vision system can automatically and correctly determine whether the probe needle is contacted with the pad or not every time in the semiconductor inspection. In addition, the manual visual inspection is not required.

(2) Getting the proper overdrive value is not required for ensuring that the probe needle is in contact with the metal surface of the pad. Thus, the time and the resource for getting the proper overdrive value are also saved.

The foregoing, as well as additional objects, features and advantages of the invention will be more readily apparent from the following detailed description, which proceeds with reference to the accompanying drawings.

DESCRIPTION OF THE PREFERRED EMBODIMENTS

Figure 1A:
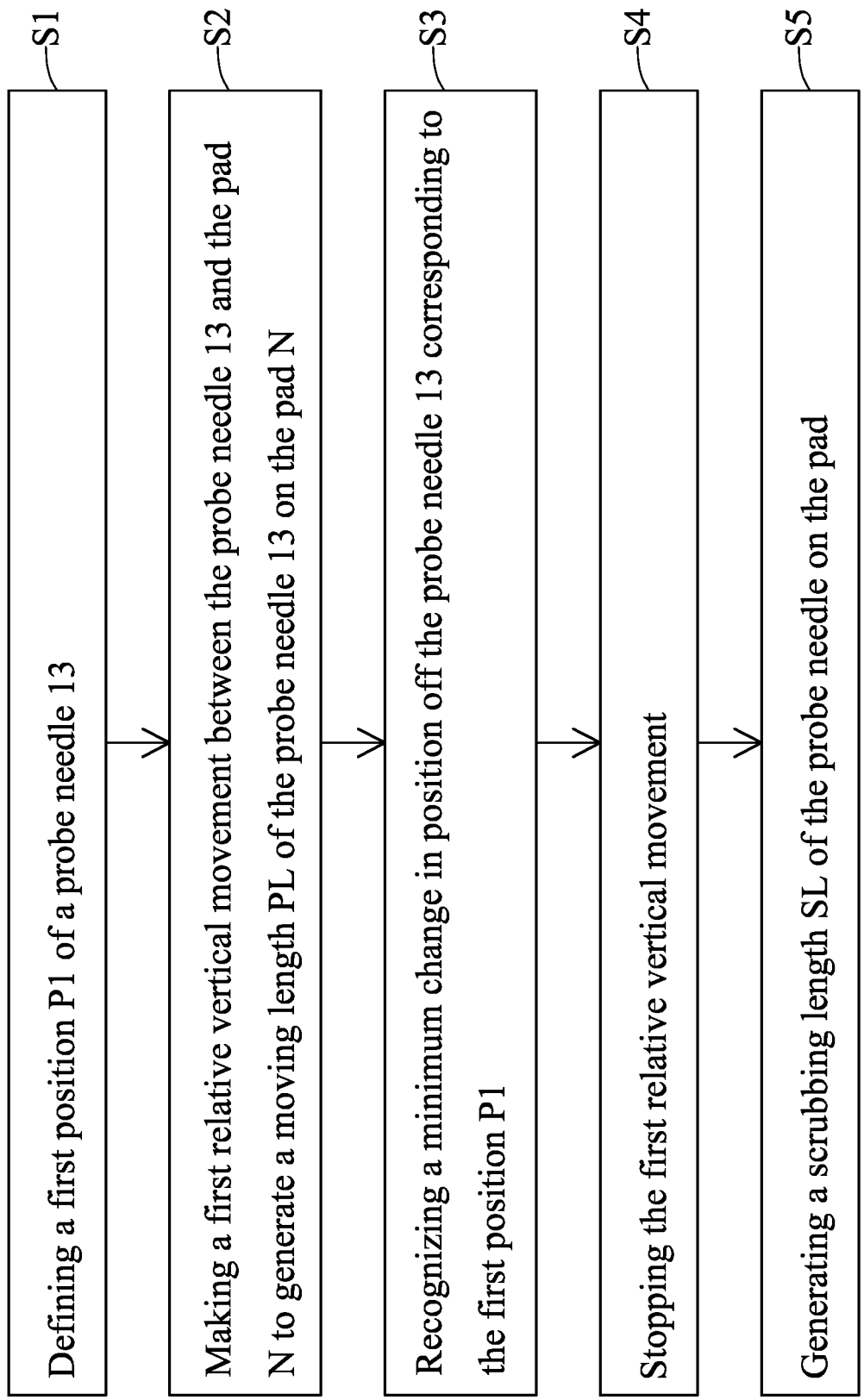
FIG. 1A illustrates a flow chart of a semiconductor inspecting method of the present disclosure.
Figure 1B:
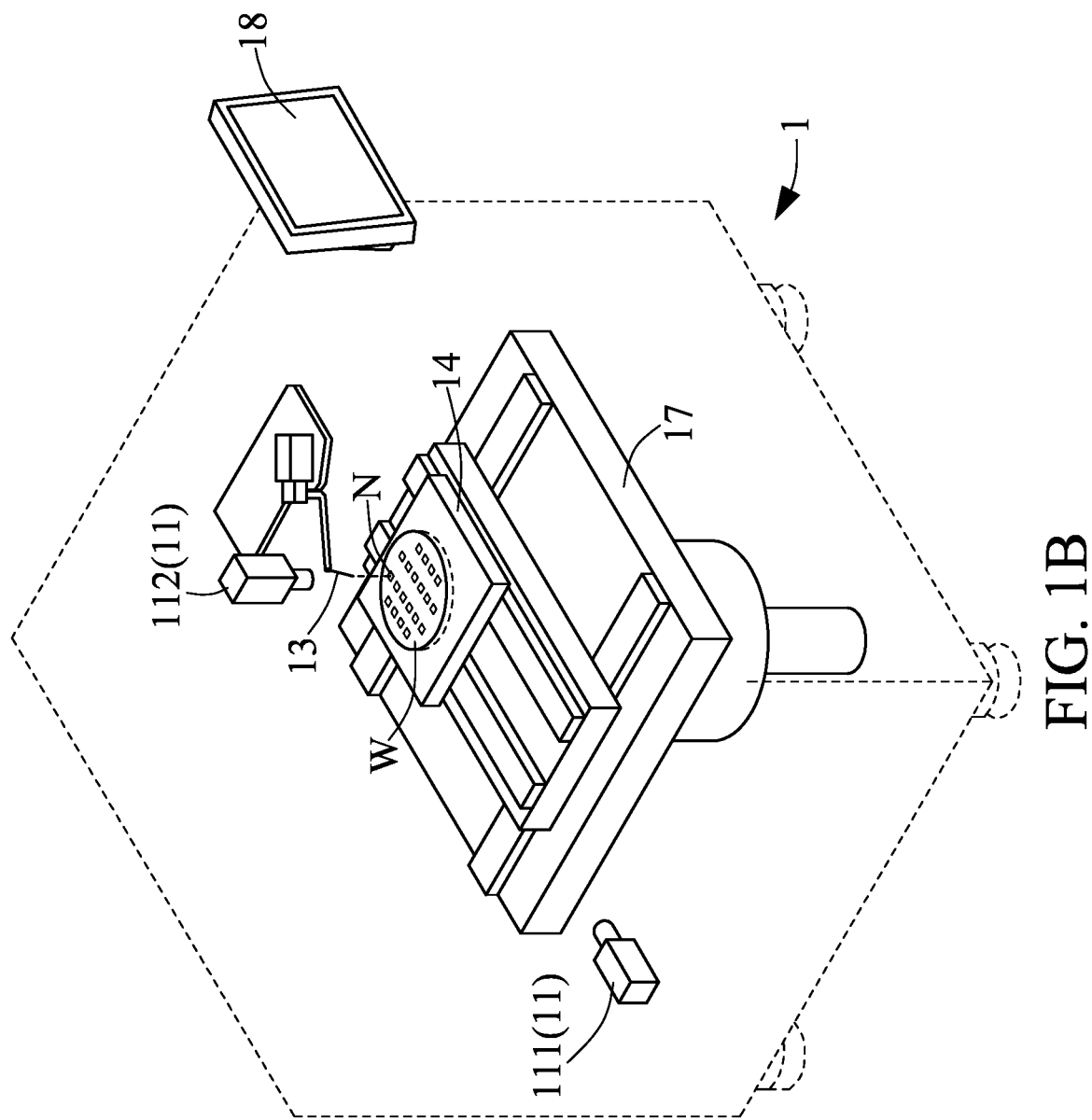
FIG. 1B illustrates a schematic view of a semiconductor inspecting system inspecting wafer.
Figure 1C:
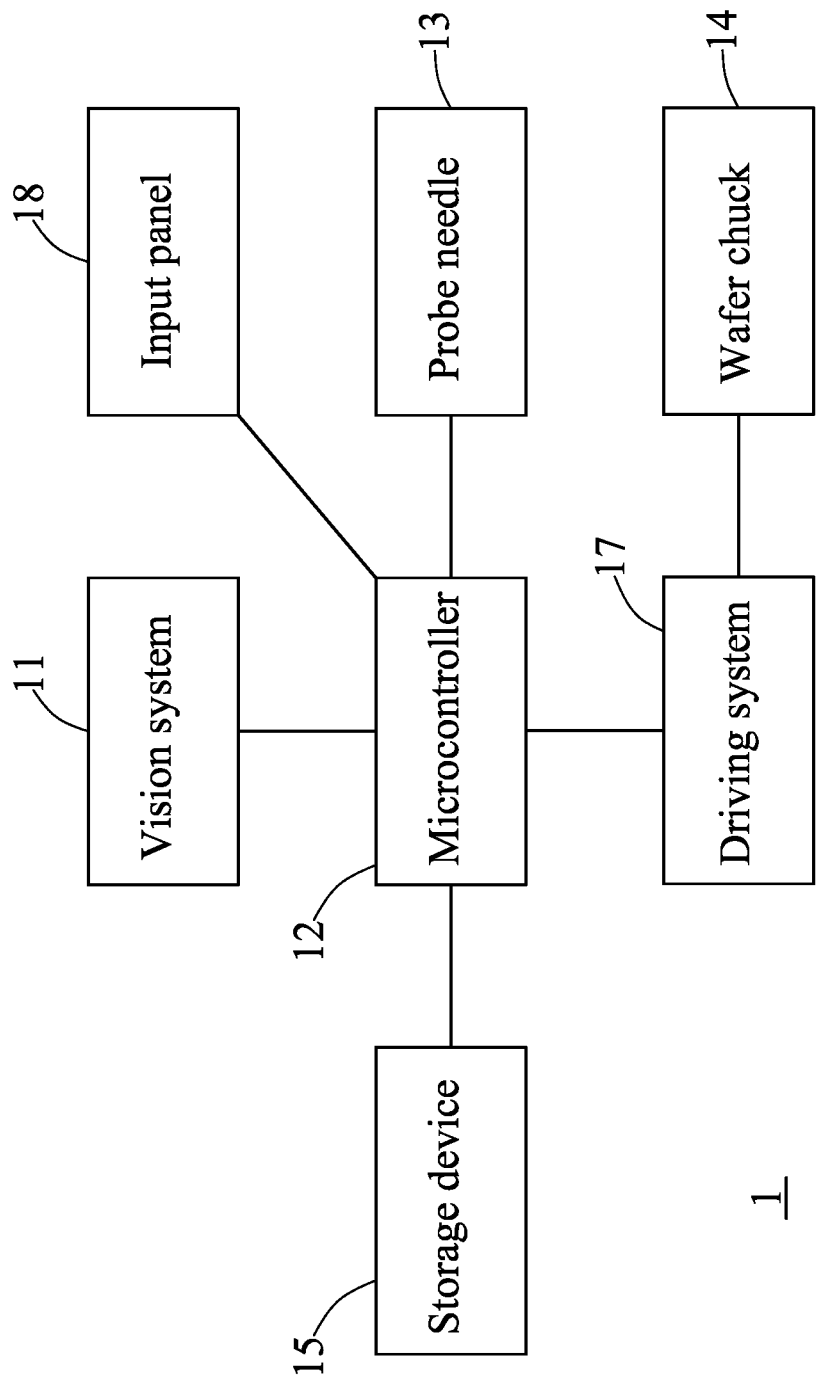
FIG. 1C illustrates a block diagram of the semiconductor inspecting system.

Please refer to FIG. 1A, FIG. 1B, and FIG. 1C. FIG. 1A illustrates a flow chart of a semiconductor inspecting method of the present disclosure. FIG. 1B illustrates a schematic view of a semiconductor inspecting system inspecting wafer. FIG. 1C illustrates a block diagram of the semiconductor inspecting system. The semiconductor inspecting method of the present disclosure is carried out by the semiconductor inspecting system 1 in the embodiment. The semiconductor inspecting system 1 includes a vision system 11, a microcontroller 12, a probe needle 13, a wafer chuck 14, a storage device 15, a driving system 17, and an input panel 18. The wafer W is disposed on the wafer chuck 14, so the semiconductor inspecting system 1 can move the wafer W by the driving system 17 to drive the wafer chuck 14. In the embodiment, the vision system 11, the probe needle 13, the storage device 15, and driving system 17, and the input panel 18 are all electrically connected to the microcontroller 12. The storage device 15 is such as hard a disk drive or a solid-state disk.

Furthermore, the vision system 11 includes a top CCD camera 112 and a side CCD camera 111. The top CCD camera 112 is located above the probe needle 13 and the side CCD camera 111 is located on the side of the probe needle 13. The side CCD camera 111 is used for the operator to see the side view of the wafer W and the probe needle 13, but the side CCD camera 111 is an unnecessary component in some embodiment. In other words, if the vision system 11 lacks the side CCD camera 111, the semiconductor inspecting method shown in FIG. 1A can also be implemented. Moreover, in the embodiment, the vision system 11 uses the CCD camera, but in some embodiment the vision system 11 can use different types of cameras, such as CMOS camera. In the embodiment, the instruction or algorithm for implementing the steps S1~S6 in FIG. 1A is stored in the storage device 15 and executed by the microcontroller 12.

Figure 2A:
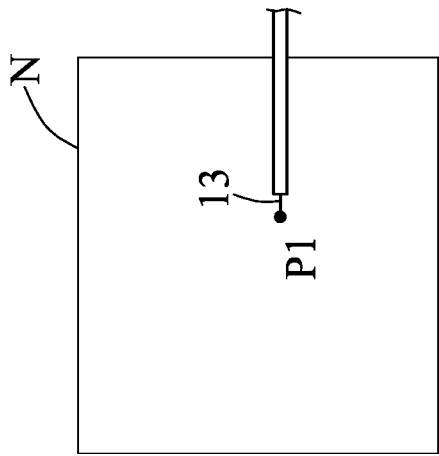
FIG. 2A~FIG. 2C illustrate an embodiment for ensuring that the probe needle is in contact with a pad.
Figure 2A:
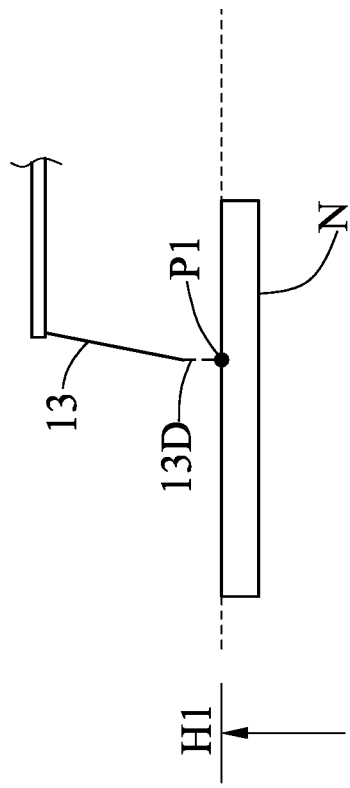
Figure 2B:
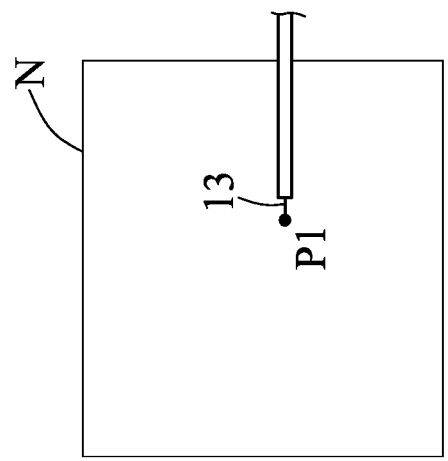
Figure 2B:
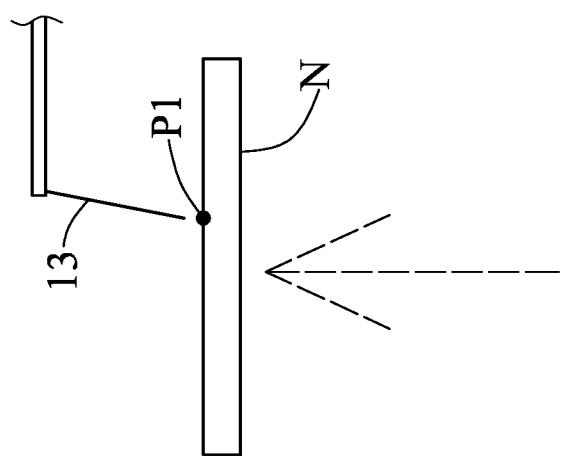
Figure 2C:
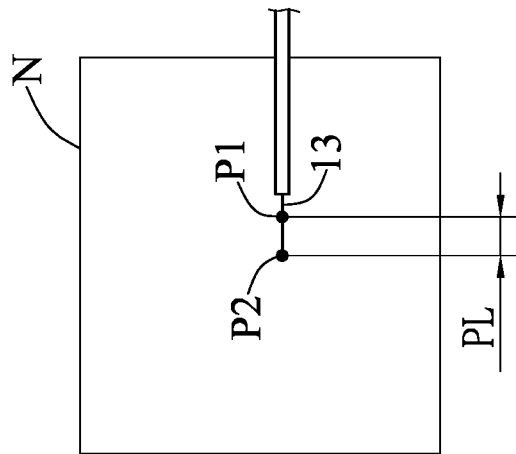
Figure 2C:
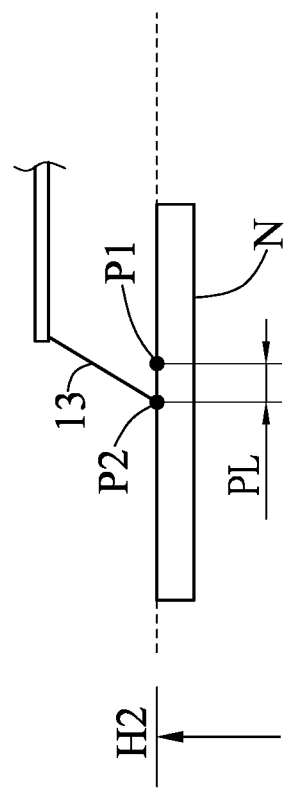

Please refer to FIG. 1A again and refer to FIG. 2A to FIG. 2C at the same time. FIG. 2A~FIG. 2C provides a front view and a side view of the probe needle and the pad in the process of the semiconductor inspecting method. The semiconductor inspecting method in the embodiment includes following steps.

First, please refer to the step S1 and FIG. 2A. The left and right sides of FIG. 2A illustrate the side and top views of the probe needle 13 and the pad N respectively at the starting location. A first position P1 of the probe needle 13 on the pad N of the wafer W is defined and obtained by the vision system 11. In detail, the dashed line 13D vertically extending downward from the tip of the probe needle 13 is corresponding to the first position P1 of the pad N. Namely, the first position P1 is the projection of the position of the needle 13 on the pad N. In the current embodiment, the position of the probe needle 13 is represented by a position of the tip of the probe needle 13. In some embodiment, the position of the probe needle 13 is represented by a position of other point on the probe needle 13. For example, the vision system 11 can select the thickest point on the probe needle 13 to represent the position of the probe needle 13.

In addition, the top view of the probe needle 13 and the pad N at the starting location (shown in right side of FIG. 2A) is photographed by the top CCD camera 112 and stored as a frame in a storage device 15 (shown in FIG. 1C) of the semiconductor inspecting system 1 in the embodiment. The x and y coordinates of the first position P1 in the frame are such as (1200, 1200). Furthermore, a height position of the wafer chuck 14 at the starting location is represented as a first reference height H1.

Next, please refer to the step S2, FIG. 2B and FIG. 2C. The left and right sides of FIG. 2B illustrate the side and top views of the probe needle 13 and the pad N respectively when the probe needle 13 and the pad N are approaching. In the step S2, a first relative vertical movement is made between the probe needle 13 and the pad N via the driving system 17 so that a moving length PL of the probe needle on the pad is generated shown in FIG. 2C. In other words, the wafer chuck 14 is driven by the driving system 17 to slowly rise so that the probe needle 13 is eventually in contact with the pad N in the embodiment. Then if the wafer chuck 14 continues to rise the probe needle 13 will slide and generate the moving length PL on the pad N. Thus, in the embodiment the length of the first relative vertical movement is the rising distance the wafer chuck 14 moves from the first reference height H1 until the moving length PL on the pad N is generated. In other words, a height position of the wafer chuck 14 is represented as a second reference height H2 when the moving length PL on the pad N is generated, and the length of the first relative vertical movement is the distance from the first reference height H1 to the second reference height H2.

In the current embodiment, the wafer chuck 14 is slowly raised and the probe needle 13 is fixed so that the probe needle 13 will be eventually in contact with the contact pad N. However, in some embodiment, the wafer chuck 14 is fixed and the probe 13 is slowly lowered so that the probe needle 13 can be in contact with the pad N.

In the step S3, the vision system 11 will recognize a minimum change in position of the probe needle 13 corresponding to the first position. The meaning of recognizing the minimum change in position of the probe needle 13 corresponding to the first position is described in the following.

Figure 3:
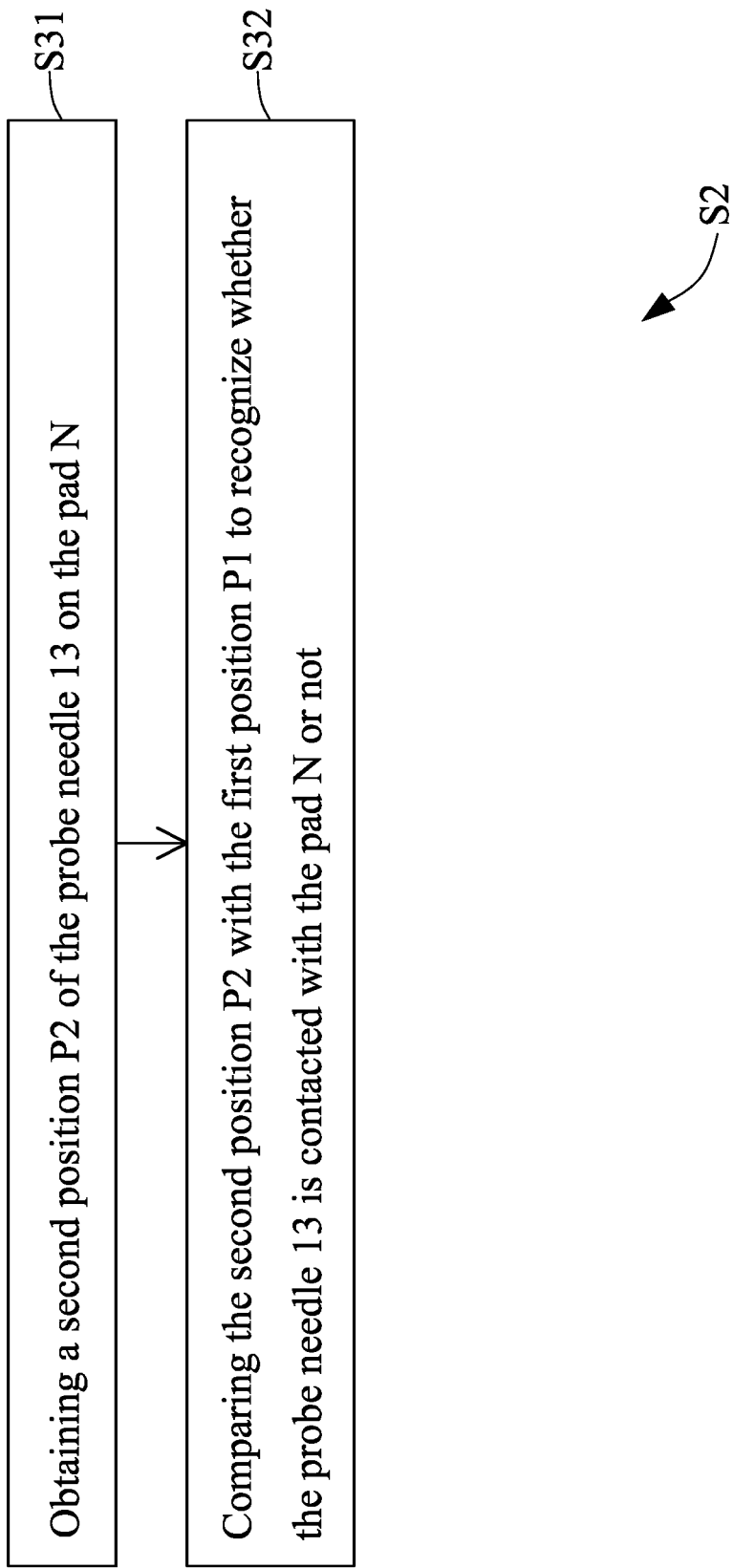
FIG. 3 illustrates a flow chart of sub-steps of a step S3.

Please see FIG. 3 for a flow chart of the step S3 in one embodiment. In the step S31, the vision system 11 obtains a second position P2 of the probe needle 13. In the embodiment, the second position P2 of the probe needle 13 is defined as the projection of the position of the tip of the probe needle 13 on the pad N when the wafer chuck 14 is rising. In the current embodiment, the vision system 11 continues to photograph the second position P2 by the top CCD camera 112 at every interval. In the step S32, after the second position P2 is photographed, the vision system 11 compares the second position P2 with the first position P1 to recognize whether the probe needle 13 is contacted with the pad N or not. In detail, the vision system 11 compares the frame of the second position P2 with the frame of the first position P1 stored in the storage device 15 (shown in FIG. 1C) of the semiconductor inspecting system 1. Before the contact of the probe needle 13 and the pad N, i.e. when the wafer chuck 14 is rising, the projection of the tip of the probe needle 13 on the pad N is the same or very similar to the projection of the tip of the probe needle 13 on the pad N when the height position of the wafer chuck 14 is at the first reference height H1. Thus, if the first position P1 is coincided with the second position P2, the vision system 11 determines the probe needle 13 is not contacted with the pad N.

When the probe needle 13 is contacted with the pad N, the tip of the probe needle 13 will start to slide on the pad N. In other words, if the moving length PL of the probe needle 13 on the pad N is generated, the second position P2 will not be coincided with the first position P1, and the vision system 11 will recognize the minimum change in position of the probe needle 13 corresponding to the first position P1. In the step S4, after the minimum change in position is recognized, the driving system 17 will stop driving the wafer chuck 14 to rise, i.e. ending the first relative vertical movement between the probe needle 13 and the pad N. In one embodiment, the driving system 17 simultaneously or immediately stops driving the wafer chuck 14 to rise when the second position P2 is not coincided with the first position P1. Thus, the moving length PL of the probe needle 13 on the pad N is usually very small, and the second position P2 is very close to the first position P1. Because of that, the top CCD camera 112 is available for easily recognizing the tiny change of the tip of the probe needle 13 than the side CCD camera.

However, the air blown from the air conditioner in the factory or the earthquake sometimes causes the probe needle 13 to deviate slightly when the wafer chuck 14 is rising. In the situation, the vision system 11 may erroneously recognize the probe needle 13 is contacted with the pad N. Thus, in some embodiment, the vision system 11 will not recognize the minimum change in position of the probe needle 13 corresponding to the first position P1 until the moving length PL of the probe needle 13 on the pad N is equal to or larger than a first preset value. In other words, if the vision system 11 compares the frame of the second position P2 with the frame of the first position P1 and detects the distance or difference between the first position P1 and the second position P2 is equal to or slightly larger than the first preset value, the minimum change in position of the probe needle 13 is recognized. The first preset value is determined based on the experiments or experiences and stored in the storage device 15 of the semiconductor inspecting system 1. In some embodiment, the first preset value is inputted by the operator via the input panel 18 (shown in FIG. 1B).

In the embodiment, the x and y coordinates of the second position P2 in the frame are such as (1000, 1200), respectively. Thus, the distance between two sets of coordinates, i.e. the first position P1 (1200, 1200) and the second position P2 (1000, 1200), is 200. Please be noted the unit of length in the frame is pixel, hence the vision system 11 or the microcontroller 12 must convert it to the actual distance based on a conversion ratio stored on the storage device 15. For example, the conversion ratio is 10 pixels:1 um, so the moving length PL in our embodiment is 20 um.

In the present disclosure, the vision system 11 can automatically and correctly determine whether the probe needle 13 is contacted with the pad N or not by recognizing the minimum change in position of the probe needle 13 corresponding to the first position P1. In contrast to the traditional semiconductor inspecting method, the manual visual inspection is not required, leading to improving the inspection efficiency. In this way, the relation (i.e. contact status) of the tip of the probe needle 13 and the pad N can be checked every time in the semiconductor inspection. Therefore, the semiconductor inspecting method in the present disclosure can ensure the probe needle 13 is in contact with the pad N every time quickly and precisely.

Figure 4:
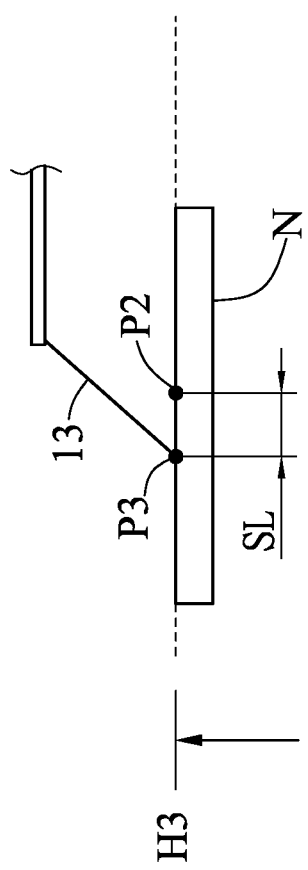
FIG. 4 illustrates an embodiment for obtaining a scrubbing length.

In addition, for scratching the oxide layer covered on the metal surface of the pad N to make the probe needle 13 test the silicon wafer effectively, the wafer chuck 14 will continue to rise to make the tip of the probe needle 13 generate a scrubbing length SL (shown in FIG. 4) on the oxide layer after the vision system 11 ensures that the probe needle 13 is in contact with the pad N. Please refer to FIG. 1A again and FIG. 4. In the step S5, a second relative vertical movement between the probe needle 13 and the pad N is made by ascending the wafer chuck 14 until the scrubbing length SL generated on the pad N is equal to or slightly larger than a second preset value. The second preset value is determined based on the experiments or experiences and stored in the storage device 15 of the semiconductor inspecting system 1. In some embodiment, the second preset value is inputted by the operator via the input panel 18 (shown in FIG. 1B).

In the embodiment, the scrubbing length SL is photographed by the top CCD camera 112 and whether the scrubbing length SL is equal to or slightly larger than the second preset value is confirmed by the vision system 11. When the scrubbing length SL reaches the second preset value, the driving system 17 will stop the wafer chuck 14 continuing to rise. Thus, the length of the second relative vertical movement is the rising distance the wafer chuck 14 moves from the second reference height H2 until the scrubbing length SL on the pad N is generated. In other words, a height position of the wafer chuck 14 when the scrubbing length SL on the pad N is generated is represented as a third reference height H3, and the length of the second relative vertical movement is the distance from the second reference height H2 to the third reference height H3. In other words, the distance from the second reference height H2 to the third reference height H3 is called the overdrive value (OD value) in the embodiment.

In summary, by the step S5 of the semiconductor inspecting method, it is ensured that the probe needle 13 is in contact with the metal surface of the pad N even if the thermal deformation and the warpage on different wafers are existed or the probe needle is worn. Compared to the traditional semiconductor inspecting method, getting the proper overdrive value is not required in the present disclosure because the scrubbing length SL made on the pad N can be automatically obtained and confirmed every time in the present semiconductor inspecting method. Thus, the time and the resource for getting the proper overdrive value are also saved in the present disclosure.

The present invention is not limited to the foregoing embodiments, but may be modified as follows:

In the foregoing embodiments, the vision system 11 includes the top CCD camera 112 to obtain the image of the tip of the probe needle 13. In some embodiment, the vision system 11 includes the side CCD camera 111 to obtain the image of the tip of the probe needle 13. In some embodiment, a camera image is got or obtained by the scanning electron microscope (SEM) or the scanning ion microscope (SIM) from above or side.

Although the description above contains many specifics, these are merely provided to illustrate the invention and should not be construed as limitations of the invention's scope. Thus, it will be apparent to those skilled, in the art that various modifications and variations can be made in the system and processes of the present disclosure without departing from the spirit or scope of the invention.

What is claimed is:

1. A semiconductor inspecting method, comprising multiple steps of:
    (a) defining a first position of a probe needle in a image from above by adopting a vision system of a semiconductor inspecting system;
    (b) making a first relative vertical movement between the probe needle and the pad by adopting a driving system of the semiconductor inspecting system;
    (c) recognizing whether the probe needle corresponding to the first position in the image has a minimum change in position due to the first relative vertical movement by adopting the vision system of the semiconductor inspecting system; and
    (d) once the minimum change in position of the probe needle caused by the probe needle being contacted with the pads is recognized, stopping the first relative vertical movement by adopting the driving system of the semiconductor inspecting system;
    wherein the step (c) further comprises multiple steps of:
    (c1) obtaining a second position of the probe needle in the image by adopting the vision system; and
    (c2) comparing the second position with the first position to recognize whether the probe needle is contacted with the pad or not;
    wherein the second position is defined as a position of the probe needle on the pad in the image after the first relative vertical movement and the probe needle being contacted with the pad to generate the minimum change in position of the probe needle.

2. The semiconductor inspecting method according to claim 1 wherein in the step (c2) the probe needle is recognized as being contacted with the pad if a moving length of the probe needle on the pad is equal to or larger than a first preset value.

3. The semiconductor inspecting method according to claim 1, wherein step (d) is comprising of simultaneously stopping the first relative vertical movement when the minimum change in position of the probe needle corresponding to the first position is recognized.

4. The semiconductor inspecting method according to claim 1, wherein the vision system comprises a top CCD mounting above the pad.

5. The semiconductor inspecting method according to claim 1, after the step (d) further comprising a step of:
    (e) making a second relative vertical movement between the probe needle and the pad by adopting the driving system of the semiconductor inspecting system in order to generate a scrubbing length of the probe needle on the pad wherein the scrubbing length is equal to or slightly larger than a second preset value.

* * * * *